(12) United States Patent
Yu

(10) Patent No.: US 12,382,810 B2
(45) Date of Patent: Aug. 5, 2025

(54) ORGANIC ELECTROLUMINESCENT DISPLAY PANEL AND MANUFACTURING METHOD THEREFOR, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventor: Tiancheng Yu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 842 days.

(21) Appl. No.: 17/435,083

(22) PCT Filed: Feb. 7, 2021

(86) PCT No.: PCT/CN2021/075829
§ 371 (c)(1),
(2) Date: Aug. 31, 2021

(87) PCT Pub. No.: WO2021/164599
PCT Pub. Date: Aug. 26, 2021

(65) Prior Publication Data
US 2022/0140017 A1 May 5, 2022

(30) Foreign Application Priority Data
Feb. 20, 2020 (CN) .................. 202010105135.X

(51) Int. Cl.
*H10K 59/35* (2023.01)
*H10K 50/125* (2023.01)
(Continued)

(52) U.S. Cl.
CPC ........ *H10K 59/35* (2023.02); *H10K 59/8792* (2023.02); *H10K 59/122* (2023.02);
(Continued)

(58) Field of Classification Search
CPC .. H10K 59/38; H10K 59/8792; H10K 59/122; H10K 59/173; H10K 59/35;
(Continued)

(56) References Cited

U.S. PATENT DOCUMENTS

| 8,110,826 B2 | 2/2012 | Yokoyama et al. |
| 8,716,057 B2 | 5/2014 | Yokoyama et al. |

(Continued)

FOREIGN PATENT DOCUMENTS

| CN | 102841399 A | * 12/2012 | ............... C08J 5/18 |
| CN | 110048024 A | * 7/2019 | ........... H10K 50/115 |

(Continued)

OTHER PUBLICATIONS

International Search Report and Written Opinion for International Application No. PCT/CN2021/075829 mailed Apr. 8, 2021.

*Primary Examiner* — Antonio B Crite
(74) *Attorney, Agent, or Firm* — XSENSUS LLP

(57) ABSTRACT

An organic electroluminescence display panel a manufacturing method thereof, and a display device are described. Each sub-pixel in the display panel includes a first electrode layer and a second electrode layer that are arranged oppositely, and an organic light-emitting function layer, and at least one of the sub-pixels further includes a light-absorbing layer disposed on a side of the second electrode layer away from the organic light emitting function layer. The light-absorbing layer absorbs the wavelength band where the tailing peak of the emission spectrum curve is located.

15 Claims, 10 Drawing Sheets

(51) Int. Cl.
  *H10K 59/122* (2023.01)
  *H10K 59/173* (2023.01)
  *H10K 59/38* (2023.01)
  *H10K 59/80* (2023.01)
  *H10K 85/30* (2023.01)

(52) U.S. Cl.
  CPC ........... *H10K 59/173* (2023.02); *H10K 59/38* (2023.02); *H10K 85/322* (2023.02); *H10K 85/371* (2023.02)

(58) Field of Classification Search
  CPC ...... H10K 85/322; H05B 33/00; H05B 33/26; H05B 33/28
  See application file for complete search history.

(56) References Cited

U.S. PATENT DOCUMENTS

| | | | |
|---|---|---|---|
| 2010/0078629 A1 | 4/2010 | Yokoyama et al. | |
| 2012/0107986 A1 | 5/2012 | Yokoyama et al. | |
| 2020/0395416 A1* | 12/2020 | Bae | H10K 59/38 |

FOREIGN PATENT DOCUMENTS

| | | | | |
|---|---|---|---|---|
| CN | 111293149 A | | 6/2020 | |
| JP | 2009009725 A | * | 1/2009 | |
| JP | 2020009789 A | * | 1/2020 | ......... H01L 27/3202 |
| WO | 2020215868 A1 | | 10/2020 | |

\* cited by examiner

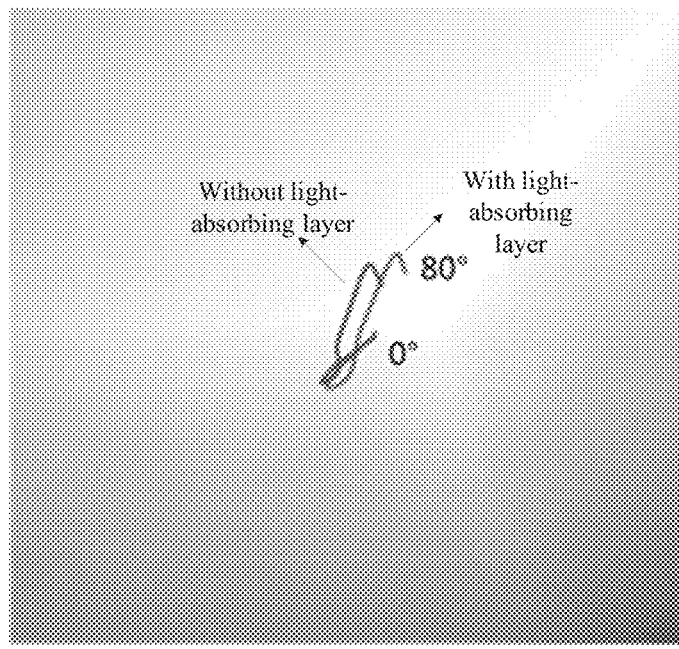

FIG. 22

```
┌─────────────────────────────────────────────────────────────────────┐
│  Providing a base substrate on which a first electrode layer, an organic light-emitting  │
│  function layer, and a second electrode layer of each of the sub-pixels are sequentially │ ~ S100
│     formed, the second electrode layer being arranged at a light emitting side          │
└─────────────────────────────────────────────────────────────────────┘
                                       │
                                       ▼
┌─────────────────────────────────────────────────────────────────────┐
│  Forming a light-absorbing layer on a side of the second electrode layer of at least one of │
│    the sub-pixels away from the organic light-emitting function layer, projections of the  │
│    light-absorbing layer and the organic light-emitting function layer on the base substrate│
│    are overlapped with each other, wherein an absorption peak wavelength of an absorption  │
│    spectrum curve of the light-absorbing layer is greater than an emission peak wavelength │ ~ S200
│       of an emission spectrum curve of a corresponding sub-pixel, a minimum absorption    │
│    wavelength of the absorption spectrum curve of the light-absorbing layer is greater than a│
│    minimum emission wavelength of the emission spectrum curve of the corresponding sub-   │
│      pixel, and a wavelength range covered by the absorption spectrum curve of the light- │
│      absorbing layer overlaps with a wavelength range covered by the emission spectrum    │
│                         curve of the corresponding sub-pixel                              │
└─────────────────────────────────────────────────────────────────────┘
```

FIG. 23

ORGANIC ELECTROLUMINESCENT DISPLAY PANEL AND MANUFACTURING METHOD THEREFOR, AND DISPLAY DEVICE

CROSS REFERENCE TO RELATED APPLICATIONS

The present disclosure is a national phase application under 35 U.S.C. § 371 of International Application No. PCT/CN2021/075829 filed on Feb. 7, 2021, which claims the benefit of and priority to Chinese Patent Application No. 202010105135.X filed on Feb. 20, 2020, entitled "Organic Electroluminescence Display Panel and Manufacturing Method thereof, and Display Device," the contents of both of which being incorporated by reference in their entireties herein.

TECHNICAL FIELD

The present disclosure relates to the field of display technology and, in particular, to an organic electroluminescence display panel, a manufacturing method thereof, and a display device.

BACKGROUND

The various applications of OLED display screens is growing, and the OLED display screen has become the mainstream display screen for mobile communication terminals. However, when compared to the new generation of quantum dot display technology (QLED), a peak width of an emission spectrum of an OLED device is larger, which is not as good as QLED technology in terms of wide color gamut.

By analyzing an electroluminescence spectra of the OLED device, it is found that a red, green, and blue spectrum have a relatively obvious tailing in the long wavelength direction. Such tailing peak seriously affects color saturation and color gamut of the three primary colors of red, green, and blue.

It should be noted that the information of the present disclosure in the above background section is only used for enhancing the understanding of the background of the present disclosure, and therefore may include information that does not constitute the prior art known to those skilled in the art.

SUMMARY

The present disclosure provides an organic electroluminescence display panel, a manufacturing method thereof, and a display device.

An aspect of the present disclosure provides an organic electroluminescence display panel, including: a base substrate on which a plurality of sub-pixels are formed, each of the sub-pixels including a first electrode layer and a second electrode layer arranged opposite to each other; and an organic light-emitting function layer between the first electrode layer and the second electrode layer, the second electrode layer being arranged at a light emitting side, wherein at least one of the sub-pixels further includes:

a light-absorbing layer arranged at a side of the second electrode layer away from the organic light-emitting function layer, projections of the light-absorbing layer and the organic light-emitting function layer on the base substrate being overlapped with each other, wherein an absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel.

In an exemplary embodiment of the present disclosure, the plurality of sub-pixels include at least one of green sub-pixels and blue sub-pixels, and wherein at least one of the green sub-pixels and/or at least one of the blue sub-pixels includes the light-absorbing layer.

In an exemplary embodiment of the present disclosure, the plurality of sub-pixels include red sub-pixels, green sub-pixels, and blue sub-pixels, wherein each of the green sub-pixels and/or each of the blue sub-pixels includes the light-absorbing layer.

In an exemplary embodiment of the present disclosure, the absorption peak wavelength of the absorption spectrum curve of the light-absorbing layer corresponding to the blue sub-pixel is between 480-510 nm.

In an exemplary embodiment of the present disclosure, a material of the light-absorbing layer includes a compound represented by a following structural formula (1):

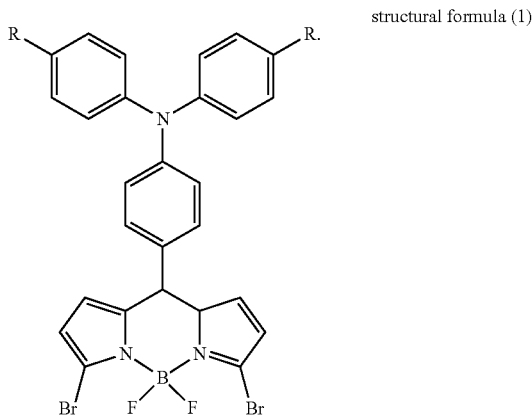

structural formula (1)

In an exemplary embodiment of the present disclosure, the absorption peak wavelength of the absorption spectrum curve of the light-absorbing layer corresponding to the green sub-pixel is between 560-610 nm.

In an exemplary embodiment of the present disclosure, a material of the light-absorbing layer includes a compound represented by a following structural formula (2):

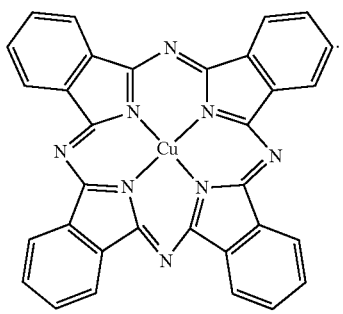

structural formula (2)

In an exemplary embodiment of the present disclosure, the sub-pixel further include a pixel defining layer for defining a sub-pixel area, the pixel defining layer has an opening, and the light-absorbing layer corresponding to the sub-pixel includes a portion located in the opening of the pixel defining layer; and in a thickness direction of the display panel, a distance from a surface of the light-absorbing layer, located in the opening, away from the base substrate to the base substrate is less than or equal to a distance from a surface of the pixel defining layer away from the base substrate to the base substrate.

In an exemplary embodiment of the present disclosure, a thickness of the light-absorbing layer is not greater than 1 µm.

In an exemplary embodiment of the present disclosure, each of the sub-pixels further includes an encapsulation layer formed at a side of the second electrode layer away from the organic light-emitting function layer and covering the light-absorbing layer.

An aspect of the present disclosure provides a method for manufacturing an organic electroluminescence display panel including a plurality of sub-pixels, including:

providing a base substrate on which a first electrode layer, an organic light-emitting function layer, and a second electrode layer of each of the sub-pixels are sequentially formed, the second electrode layer being arranged at a light emitting side;

forming a light-absorbing layer on a side of the second electrode layer of at least one of the sub-pixels away from the organic light-emitting function layer, projections of the light-absorbing layer and the organic light-emitting function layer on the base substrate being overlapped with each other, wherein an absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel.

In an exemplary embodiment of the present disclosure, the light-absorbing layer is formed by an evaporation method.

In an exemplary embodiment of the present disclosure, the method further includes:

forming an encapsulation layer covering the second electrode layer and the light-absorbing layer.

An aspect of the present disclosure provides a display device including any one of the above organic electroluminescence display panels.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments that conform to the present disclosure, and together with the specification, serve to explain the principle of the present disclosure. Understandably, the drawings in the following description are only some embodiments of the present disclosure, and other drawings can be obtained by those skilled in the art from these drawings without creative work.

FIG. 22 shows the influence of a light-absorbing layer on color shift of white light at a viewing angle of 0-80°; and FIG. 23 is a schematic flow chart of a method of manufacturing a display panel according to an embodiment.

DETAILED DESCRIPTION

Figure 1:
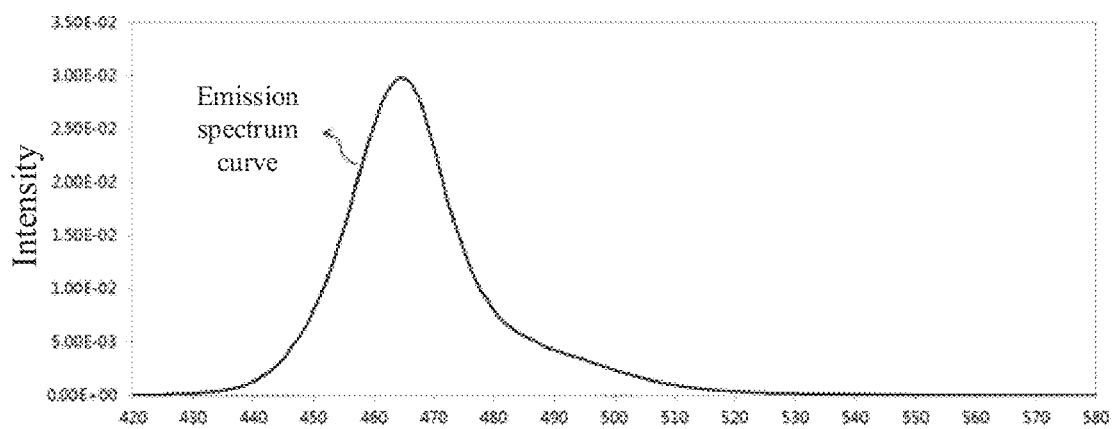
FIG. 1 shows an electroluminescence spectrum of blue light of an OLED device at a viewing angle of 0° (front viewing angle)

Example embodiments will now be described more fully with reference to the accompanying drawings. However, the example embodiments may be implemented in various forms, and should not be construed as being limited to the embodiments set forth herein. On the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted.

In the related art, referring to FIG. 1, which shows an electroluminescence spectrum of blue light of an OLED device at a viewing angle of 0° (front viewing angle), an electroluminescence spectrum curve of blue light has a notable tailing peak in the region of 480-510 nm. Similarly, an electroluminescence spectrum curve of green light has an obvious tailing peak in the region of 560-590 nm. Such tailing peak widens peak widths of blue and green light emission spectrum curves, and moves the blue and green light emission spectrum curves toward the long wavelength, which will affect color saturation. At the same time, when the three primary colors are matched, the color gamut presented is small, and it is difficult to reach a higher level in terms of a wide color gamut. At present, it is difficult to avoid such tailing by developing new luminescent materials.

In view of the above problem, an embodiment of the present disclosure provides an organic electroluminescence display panel (hereinafter referred to as an OLED display panel), which may eliminate the shortcomings of long-wavelength tailing in the emission spectrum and may improve the display color gamut.

Figure 2:
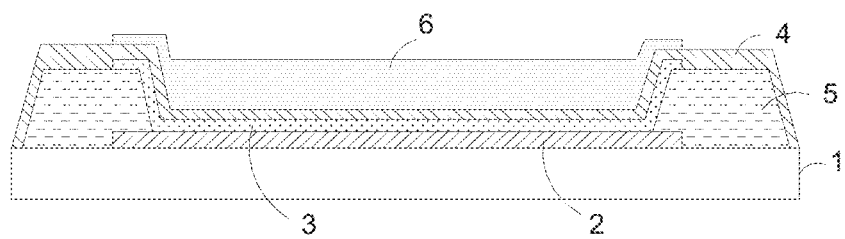
FIG. 2 is a schematic diagram of a structure of a sub-pixel including a light-absorbing layer according to an embodiment of the present disclosure.
Figure 3:
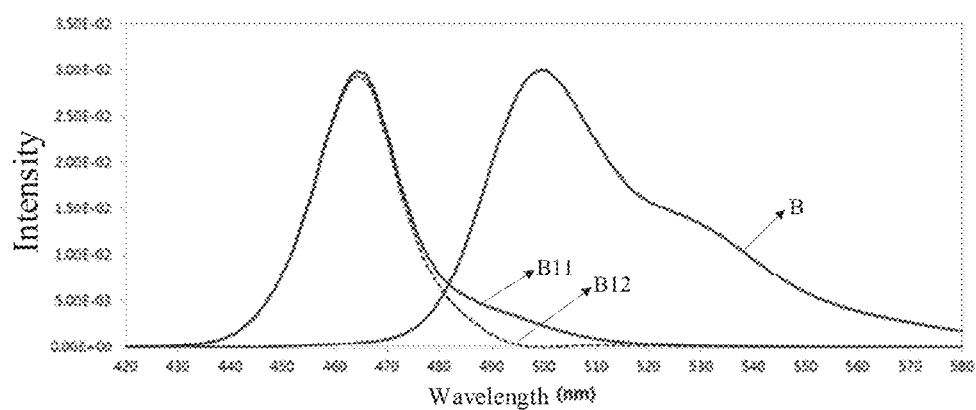
FIG. 3 shows the influence of a light-absorbing layer on a blue light spectrum with a viewing angle of 0°.

The OLED display panel according to an embodiment of the present disclosure includes a base substrate 1 on which a plurality of sub-pixels are formed. As shown in FIG. 2, each of the sub-pixels includes a first electrode layer 2 and a second electrode layer 4 arranged opposite to each other on the base substrate 1; and an organic light-emitting function layer 3 between the first electrode layer 2 and the second electrode layer 4, the second electrode layer 4 being arranged at a light emitting side. At least one of the sub-pixels further includes a light-absorbing layer 6 arranged at a side of the second electrode layer 4 away from the organic light-emitting function layer 3, and projections of the light-absorbing layer 6 and the organic light-emitting function layer 3 on the base substrate 1 are overlapped with each other. An absorption peak wavelength of an absorption spectrum curve of the light-absorbing layer 6 is greater than an emission peak wavelength of an emission spectrum curve of a corresponding sub-pixel, a minimum absorption wavelength of the absorption spectrum curve of the light-absorbing layer 6 is greater than a minimum emission wavelength of the emission spectrum curve of the corresponding sub-pixel, and a wavelength range covered by the absorption spectrum curve of the light-absorbing layer 6 overlaps with a wavelength range covered by the emission spectrum curve of the corresponding sub-pixel.

The absorption spectrum curve refers to a curve drawn by irradiating a light-absorbing material with light of different wavelengths, and measuring light absorption intensities of the material with respect to the light of different wavelengths respectively. Referring to FIGS. 3 to 6 and FIGS. 10 to 13, the abscissa is a light wavelength, and the ordinate is a light absorption intensity. The absorption peak wavelength refers to a wavelength corresponding to the maximum light absorption intensity of the material, that is, the wavelength corresponding to the highest point in the absorption spectrum curve. The minimum absorption wavelength refers to the minimum wavelength in the wavelength band where the material absorbs light, that is, the wavelength corresponding to that when the absorption intensity on the left side of the absorption spectrum curve starts to be greater than 0. The maximum absorption wavelength refers to the maximum wavelength in the wavelength band of the light absorbed by the light-absorbing material, that is, the wavelength corresponding to that when the absorption intensity on the right side of the absorption spectrum curve drops to 0.

The emission spectrum curve refers to a curve drawn by measuring luminous intensities of light of different wavelengths emitted by a luminescent material respectively. Referring to FIGS. 3 to 6 and FIGS. 11 to 14, the abscissa is a light wavelength, and the ordinate is a luminous intensity. The emission peak wavelength refers to a wavelength corresponding to the maximum luminous intensity of the material, that is, the wavelength corresponding to the highest point in the emission spectrum curve. The minimum emission wavelength refers to the minimum wavelength in the wavelength band of the light emitted by the material, that is, the wavelength corresponding to that when the luminous intensity on the left side of the emission spectrum curve starts to be greater than 0. The maximum emission wavelength refers to the maximum wavelength in the wavelength band of the light emitted by the material, that is, the wavelength corresponding to that when the luminous intensity on the right side of the emission spectrum curve drops to 0.

The light-absorbing layer is arranged on the light-emitting side. For the same sub-pixel, the absorption spectrum curve of the light-absorbing layer is located on the right side of the emission spectrum curve and overlaps with the tailing peak, therefore the light-absorbing layer can absorb the light in the wavelength band where the tailing peak is located, thereby cutting off the tailing peak part of the emission spectrum curve and thus narrowing the peak width of the emission spectrum curve, which can improve the color gamut of the OLED device.

The structure and principle of the OLED display panel according to an embodiment of the present disclosure will be described in detail below.

Taking a bottom emission device as an example, the first electrode layer 2 is an anode layer, the second electrode layer 4 is a cathode layer, the anode layer is provided on the base substrate 1, and the cathode layer is arranged on the light-emitting side. Therefore, the light-absorbing layer 6 is arranged at a side of the cathode layer away from the organic light-emitting function layer 3 and covers the cathode layer. The organic light-emitting function layer 3 may include an electron injection layer, an electron transport layer, a light-emitting layer, a hole transport layer, a hole injection layer, and of course, may further include an electron blocking layer, a hole blocking layer and the like. The specific structure of the organic light-emitting function layer will not be repeated here.

Taking a blue sub-pixel as an example, FIGS. 3 to 6 shows the influence of the light-absorbing layer of the sub-pixel on a blue light spectrum at different viewing angles (0°, 15°, 30°, 45°). Specifically, in FIG. 3, the curve B11 is an original blue light spectrum curve at a viewing angle of 0° (that is, a front viewing angle), the curve B is a absorption spectrum curve of the light-absorbing layer, and the curve B12 is a blue light spectrum curve at a viewing angle of 0° (that is, a front viewing angle) cut by the light-absorbing layer. It can be seen that in the original blue light spectrum curve B11, the emission peak wavelength is about 465 nm, the minimum emission wavelength is about 430 nm, the maximum emission wavelength is about 520 nm, and there is a strong tailing peak at 480-510 nm. In the absorption spectrum curve B of the light-absorbing layer, the absorption peak wavelength is about 500 nm, the minimum absorption wavelength is about 450 nm, the maximum absorption wavelength is greater than 580 nm, and there is strong absorption in the region of 480-510 nm. After being absorbed by the light-absorbing layer, in the blue light spectrum curve B12, the emission peak wavelength is about 465 nm, the minimum emission wavelength is about 430 nm, and the maximum emission wavelength is about 500 nm.

Figure 4:
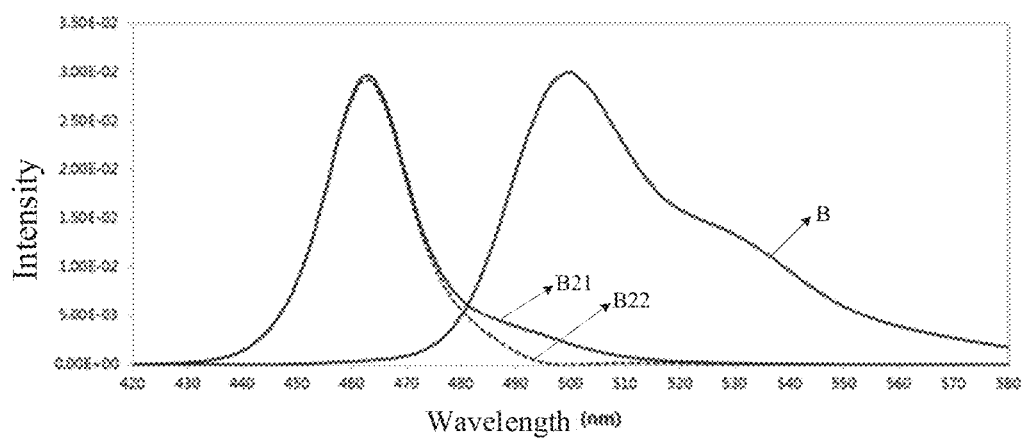
FIG. 4 shows the influence of a light-absorbing layer on a blue light spectrum at a viewing angle of 15°.
Figure 5:
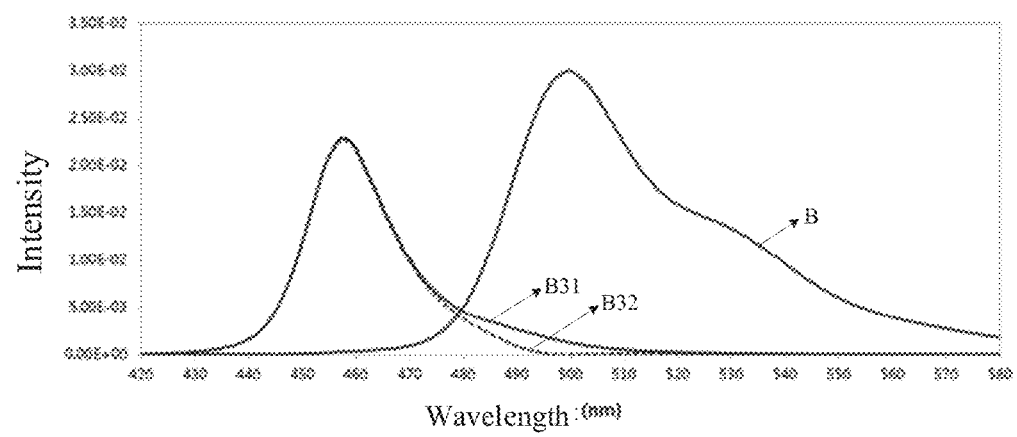
FIG. 5 shows the influence of a light-absorbing layer on a blue light spectrum at a viewing angle of 30°.
Figure 6:
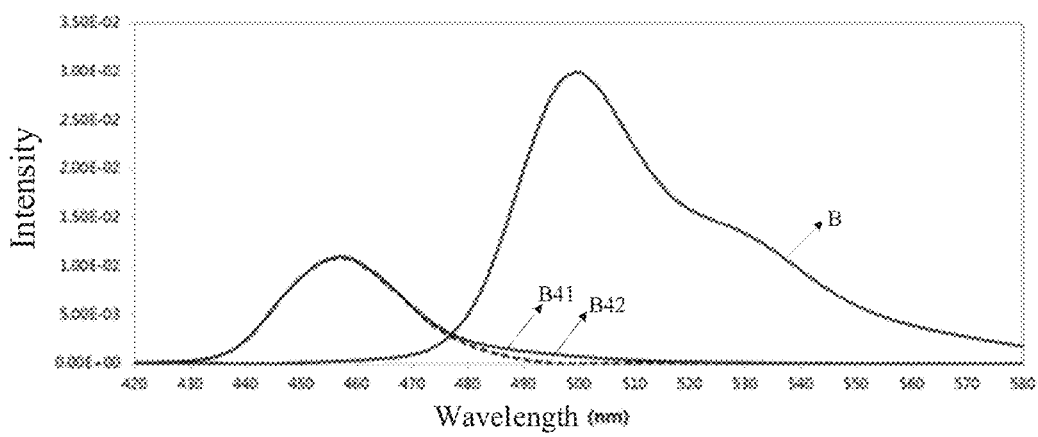
FIG. 6 shows the influence of a light-absorbing layer on a blue light spectrum at a viewing angle of 45°.

In FIG. 4, the curve B21 is an original blue light spectrum curve at a viewing angle of 15°, the curve B is an absorption spectrum curve of the light-absorbing layer, and the curve B22 is a blue light spectrum curve cut by the light-absorbing layer at a viewing angle of 15°. Similar to that at the viewing angle of 0°, after being absorbed by the light-absorbing layer, the maximum emission wavelength of the blue light spectrum curve at a viewing angle of 15° drops from 520nm to 500nm. In FIG. 5, the curve B31 is an original blue light spectrum curve at a viewing angle of 30°, the curve B is an absorption spectrum curve of the light-absorbing layer, and the curve B32 is a blue light spectrum curve cut by the light-absorbing layer at a viewing angle of 30°. Similar to that at the viewing angle of 0°, after being absorbed by the light-absorbing layer, the maximum emission wavelength of the blue light spectrum curve at the 30° viewing angle drops from 515nm to 495nm. In FIG. 6, the curve B41 is an original blue light spectrum curve at a viewing angle of 45°, the curve B is an absorption spectrum curve of the light-absorbing layer, and the curve B42 is a blue light spectrum curve cut by the light-absorbing layer at a viewing angle of 45°. Similar to that at the viewing angle of 0°, after being absorbed by the light-absorbing layer, the maximum emission wavelength of the blue light spectrum curve at the viewing angle of 45° drops from 510nm to 495nm.

It can be seen that the luminous intensity of the blue sub-pixel provided with the light-absorbing layer at the tailing peak portion is significantly reduced, while the main peak position and luminous intensity of the spectrum remain basically unchanged.

Figure 7:
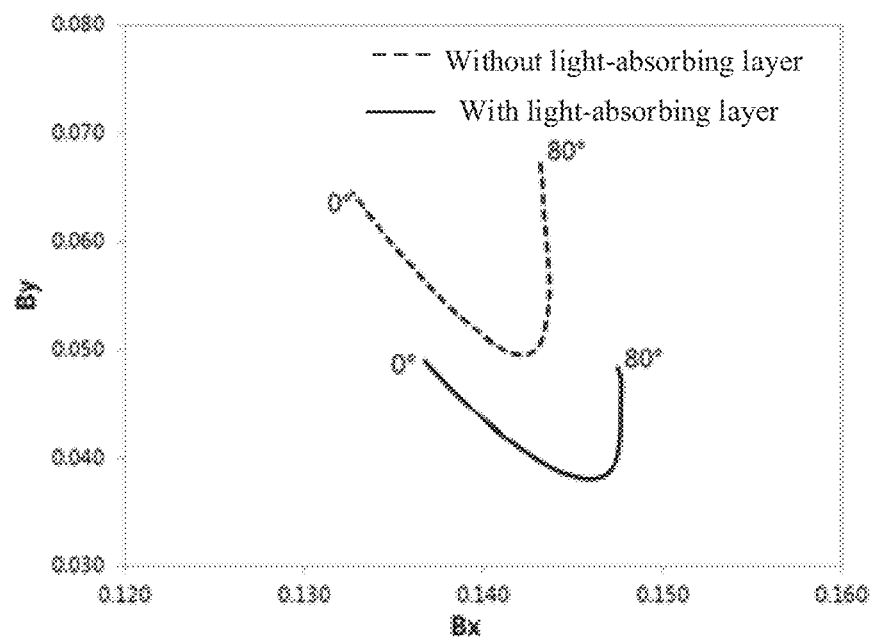
FIG. 7 shows the influence of a light-absorbing layer on a blue light CIE locus at a viewing angle of 0-80°.

CIE1931 color coordinates corresponding to the emission spectra of blue light with and without the light-absorbing layer at different viewing angles are calculated respectively. As shown in FIG. 7, the dashed line is a blue light CIE locus without the light-absorbing layer at a viewing angle of 0-80°, the solid line is a blue light CIE locus with the light-absorbing layer at a viewing angle of 0-80°, the abscissa Bx represents a blue light x value, and the ordinate By represents a blue light y value. It can be seen that within the entire viewing angle range of 0-80°, the blue light CIE locus as a whole moves to the lower right, and the By value is significantly reduced. Taking the viewing angle of 0° as an example, the By value is reduced from 0.065 to 0.049. The cutting of the blue light tailing peaks by the light-absorbing layer can enhance the blue color saturation.

Figure 8:
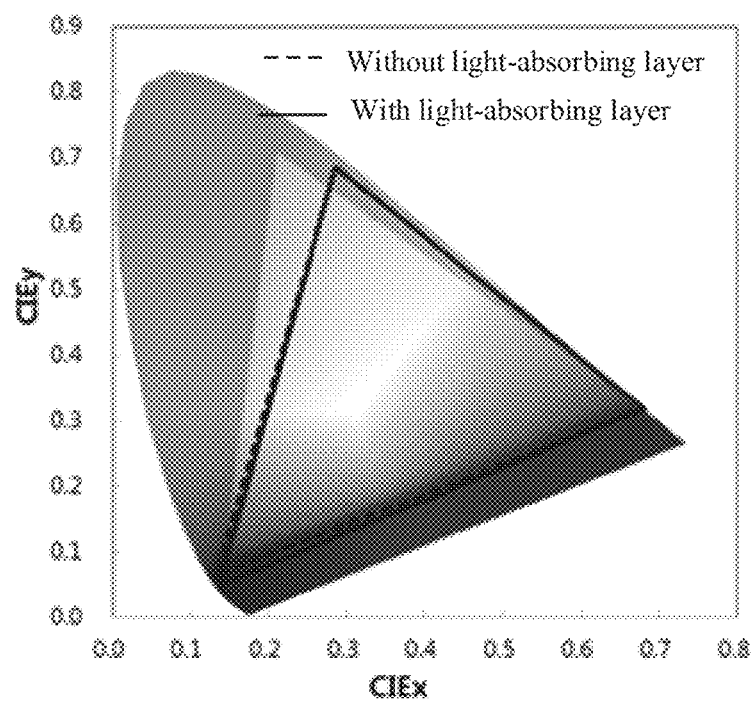
FIG. 8 shows the influence of a light-absorbing layer of a blue sub-pixel on a color gamut.

For an RGB three-primary color OLED display, arranging the light-absorbing layer in the blue sub-pixel is also conducive to widening the color gamut. For example, FIG. 8 shows a CIE1931 chromaticity diagram displayed when blue light of By=0.049 and red light and green light of Rx (red light×value)=0.681 and Gx (green light×value)=0.261 are matched. In the figure, the triangular area enclosed by the dashed line represents the emission color gamut without the light-absorbing layer, and the triangular area enclosed by the solid line represents the emission color gamut with the light-absorbing layer. Compared with the NTSC standard color gamut, the color gamut without the light-absorbing layer is 100.5%, and the color gamut with the light-absorbing layer is increased to 102.1%. It can be seen that the light-absorbing layer achieves an effective widening of the color gamut.

Figure 9:
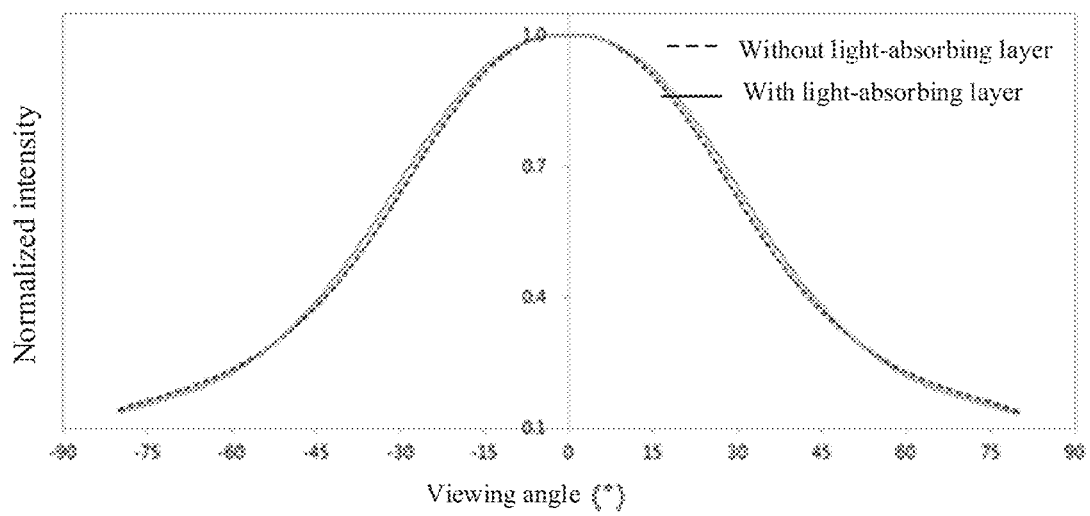
FIG. 9 shows the influence of a light-absorbing layer on a brightness reduction of blue light at a viewing angle of 0-80°.

FIG. 9 shows the influence of the light-absorbing layer on brightness reduction trend of blue light at a viewing angle of 0-80°. In the figure, the abscissa represents the viewing angles, the ordinate represents a normalized intensity of brightness, the dotted line represents the blue light brightness reduction trend without the light-absorbing layer, and the solid line represents the blue light brightness reduction trend with the light-absorbing layer. It can be seen that at a small angle (for example, <50° and)>−50°, the reduction of the blue light brightness with the light-absorbing layer is slightly slower than that without the light-absorbing layer, and at a large angle (for example, >50° or <−50°, there is no readily apparent difference. Therefore, the light-absorbing layer can slow down the reduction of blue light brightness at a small viewing angle, and maintain better display brightness.

Figure 10:
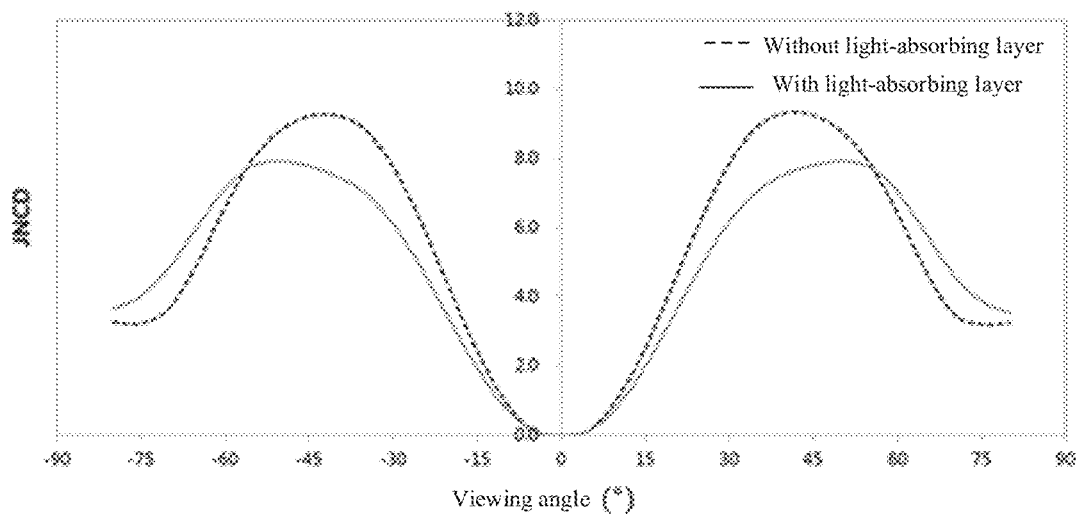
FIG. 10 shows the influence of a light-absorbing layer on a just noticeable color difference of blue light at a viewing angle of 0-80°.
Figure 11:
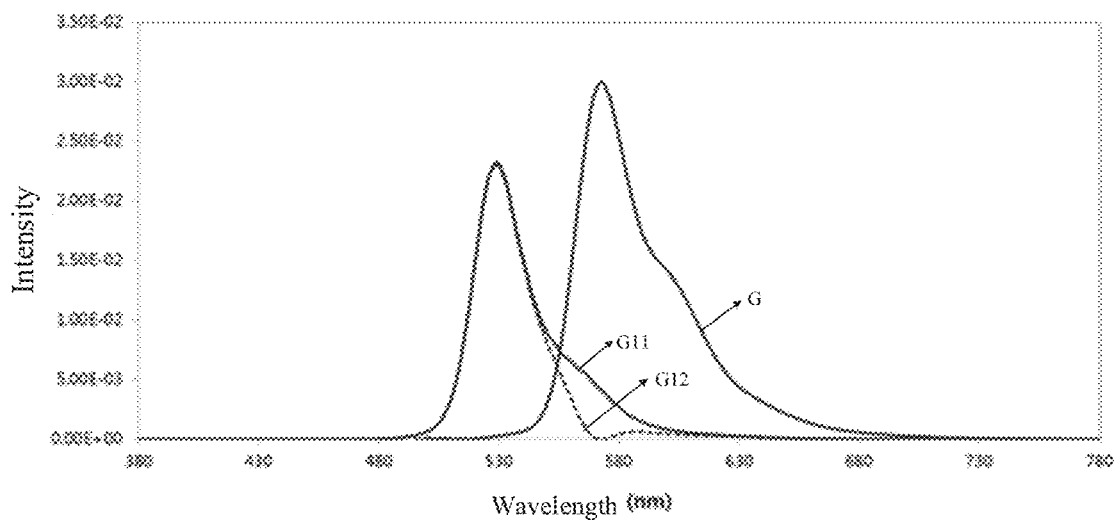
FIG. 11 shows the influence of a light-absorbing layer on a green light spectrum at a viewing angle of 0°.

FIG. 10 shows the influence of the light-absorbing layer on a just noticeable color difference (JNCD) of blue light at a viewing angle of 0-80°. In the figure, the abscissa represents the viewing angles, the ordinate represents the just noticeable color difference values (JNCD value), L5 represents the JNCD value without the light-absorbing layer, and L6 represents the JNCD value with the light-absorbing layer. It can be seen that at a small angle (for example, <50° and)>−50°, the reduction trend tends to be gentle, and the JNCD value with the light-absorbing layer is smaller than that without the light-absorbing layer. At a large angle (for example, >50° or)<−50°, the JNCD value with the light-absorbing layer is larger than that without the light-absorbing layer. Therefore, the light-absorbing layer can reduce the color shift of blue light at a small viewing angle, and improve the color tone accuracy. Since the viewing angle of the display panel is usually a small angle, the light-absorbing layer has a positive effect on maintaining ideal brightness and improving color accuracy.

Taking a green sub-pixel as an example, FIGS. 11 to 14 show the influence of the light-absorbing layer of the sub-pixel on the green light spectrum at different viewing angles (0°, 15°, 30°, 45°). Specifically, in FIG. 11, the curve G11 is an original green light spectrum curve at a viewing angle of 0° (that is, a front viewing angle), the curve G is an absorption spectrum curve of the light absorbing layer, and the curve G12 is the green light spectrum curve cut by the light-absorbing layer at a viewing angle of 0° (that is, a front viewing angle). It can be seen that in the original green light spectrum curve G11, the emission peak wavelength is about 530nm, the minimum emission wavelength is about 490nm, the maximum emission wavelength is about 610nm, and there is a strong tailing peak at 560-610nm. In the absorption spectrum curve G of the light-absorbing layer, the absorption peak wavelength is about 570nm, the minimum absorption wavelength is about 530nm, the maximum absorption wavelength is about 690nm, and there is strong absorption in the region of 560-590nm. After being absorbed by the light-absorbing layer, in the green light spectrum curve G12, the emission peak wavelength is about 625nm, the minimum emission wavelength is about 490nm, the maximum emission wavelength is about 570nm, and the peak width at half height is about 20nm.

Figure 12:
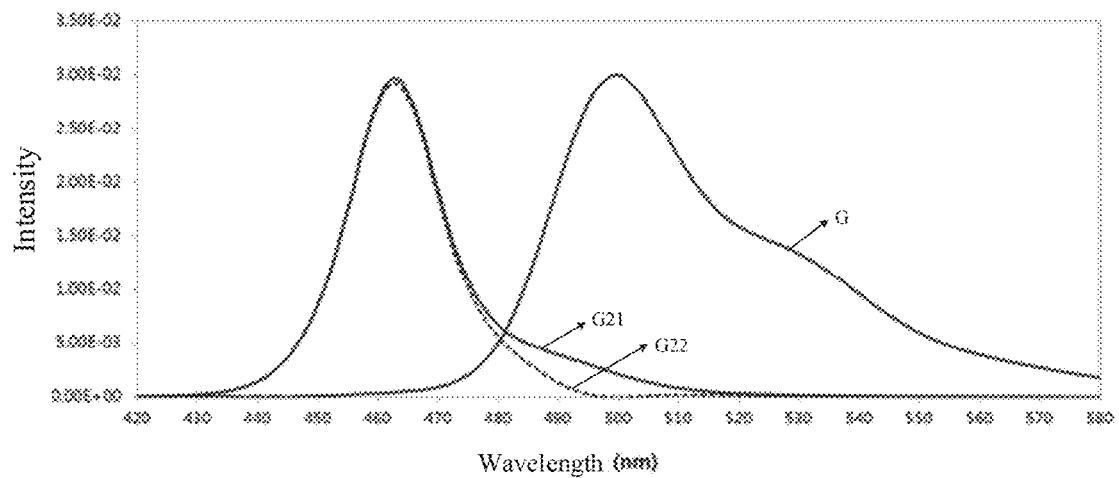
FIG. 12 shows the influence of a light-absorbing layer on a green light spectrum at a viewing angle of 15°.
Figure 13:
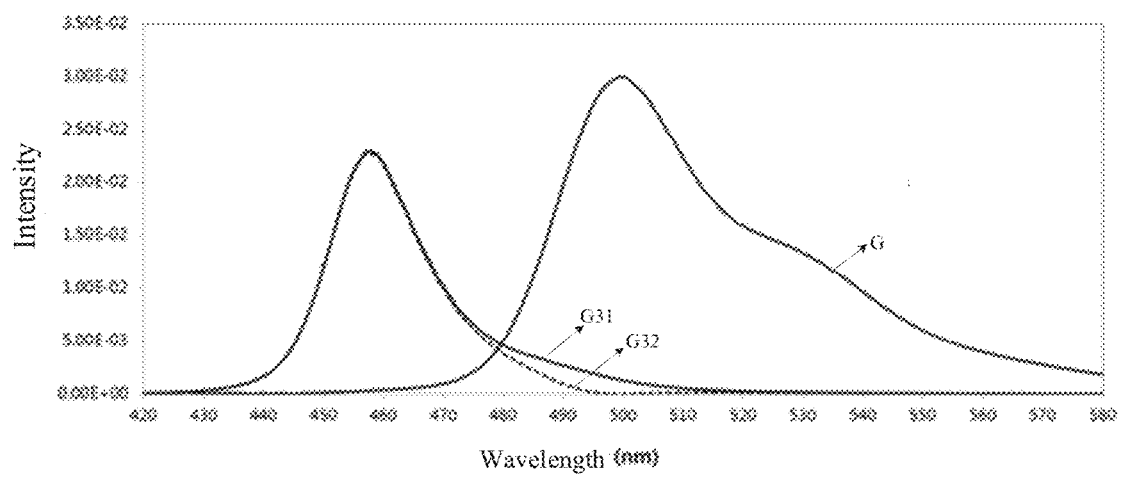
FIG. 13 shows the influence of a light-absorbing layer on a green light spectrum at a 30° viewing angle.
Figure 14:
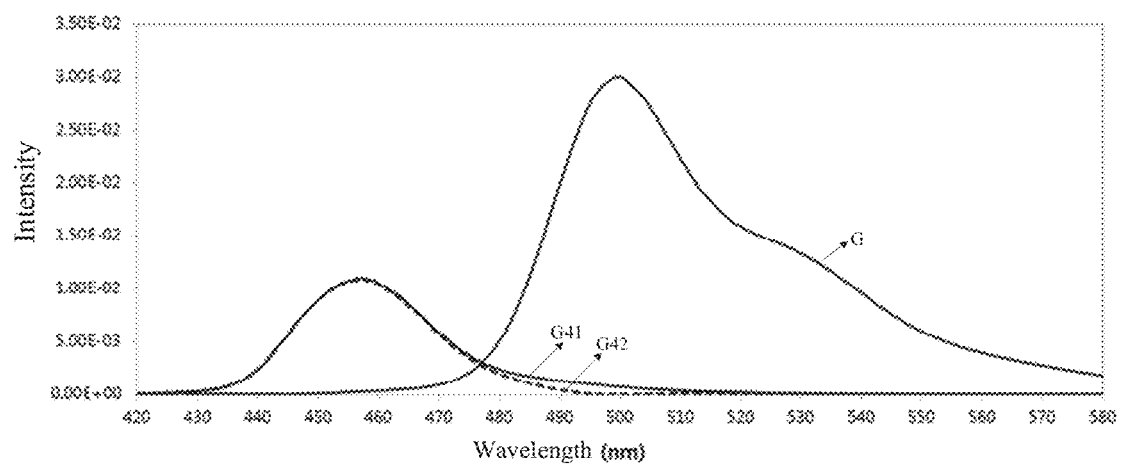
FIG. 14 shows the influence of a light-absorbing layer on a green light spectrum at a viewing angle of 45°.

In FIG. 12, the curve G21 is an original green light spectrum curve at a viewing angle of 15°, the curve G is an absorption spectrum curve of the light-absorbing layer, and the curve G22 is a green light spectrum curve cut by the light-absorbing layer at a viewing angle of 15°. Similar to that at the viewing angle of 0°, after being absorbed by the light-absorbing layer, the maximum emission wavelength of the green light spectrum curve at a viewing angle of 15° drops from 610 nm to 570 nm. In FIG. 13, the curve G31 is an original green light spectrum curve at a viewing angle of 30°, the curve G is an absorption spectrum curve of the light-absorbing layer, and the curve G32 is a green light spectrum curve cut by the light-absorbing layer at a viewing angle of 30°. Similar to that at the viewing angle of 0°, after being absorbed by the light-absorbing layer, the maximum emission wavelength of the green light spectrum curve at a viewing angle of 30° drops from 600nm to 590nm. In FIG. 14, the curve G41 is an original green light spectrum curve at a viewing angle of 45°, the curve G is an absorption spectrum curve of the light-absorbing layer, and the curve G42 is a green light spectrum curve cut by the light-absorbing layer at a viewing angle of 45°. Similar to that at the viewing angle of 0°, after being absorbed by the light-absorbing layer, the maximum emission wavelength of the green light spectrum curve at a viewing angle of 45° drops from 600nm to 590nm.

It can be seen that the luminous intensity of the green sub-pixel provided with the light-absorbing layer in the tailing peak portion is significantly reduced, while the position of the main peak of the spectrum and the luminous intensity remain basically unchanged.

Figure 15:
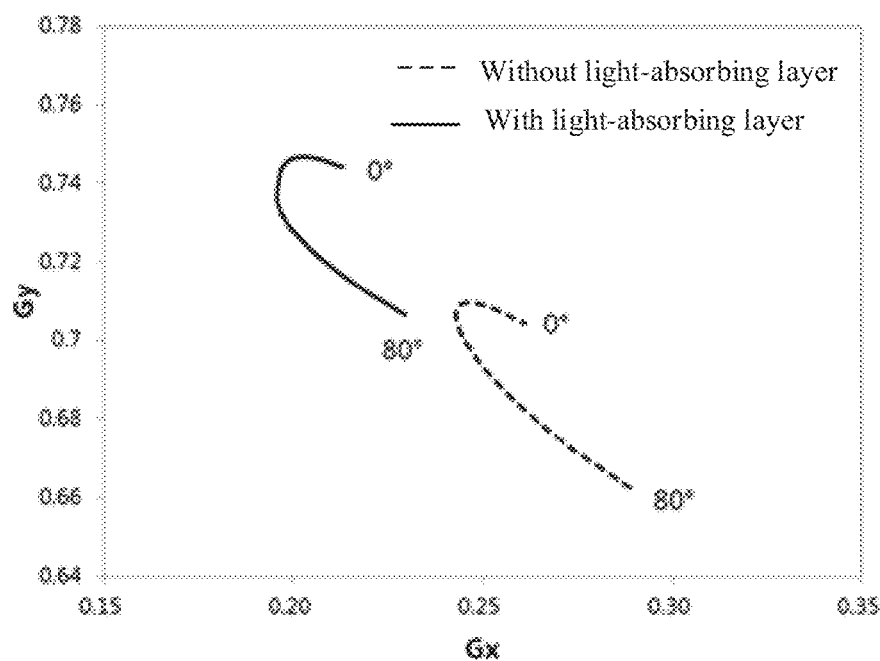
FIG. 15 shows the influence of a light-absorbing layer on a green light CIE locus at a viewing angle of 0-80°.

CIE1931 color coordinates corresponding to the emission spectra of green light with and without the light-absorbing layer at different viewing angles are calculated respectively. As shown in FIG. 15, the dashed line is a green light CIE locus without the light-absorbing layer at a viewing angle of 0-80°, the solid line is a green light CIE locus with the light-absorbing layer at a viewing angle of 0-80°, the abscissa Gx represents a green light x value, and the ordinate Gy represents a green light y value. It can be seen that within the entire viewing angle range of 0-80°, the green light CIE locus as a whole moves to the upper left, and the Gy value is significantly reduced. Taking the viewing angle of 0° as an example, the Gy value is reduced from 0.261 to 0.213. The cutting of the green light tailing peaks by the light-absorbing layer can enhance the green color saturation.

Figure 16:
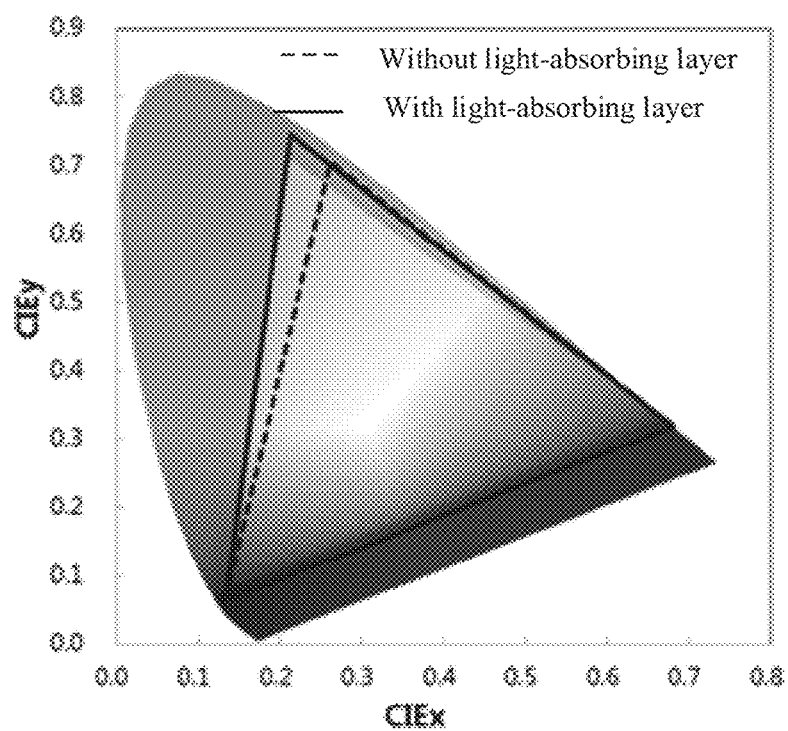
FIG. 16 shows the influence of a light-absorbing layer of a green sub-pixel on a color gamut.

For an RGB three-primary color OLED display, arranging the light-absorbing layer in the green sub-pixel is also conducive to widening the color gamut. For example, FIG. 16 shows a CIE1931 chromaticity diagram displayed when green light of Gx=0.261 and red light and blue light of Rx (red light×value)=0.681 and Gy (blue light×value)=0.065 are matched. In the figure, the triangular area enclosed by the dashed line represents the emission color gamut without the light-absorbing layer, and the triangular area enclosed by the solid line represents the emission color gamut with the light-absorbing layer. Compared with the NTSC standard color gamut, the color gamut without the light-absorbing layer is 100.5%, and the color gamut with the light-absorbing layer is increased to 111.3%. It can be seen that the light-absorbing layer achieves an effective widening of the color gamut.

Figure 17:
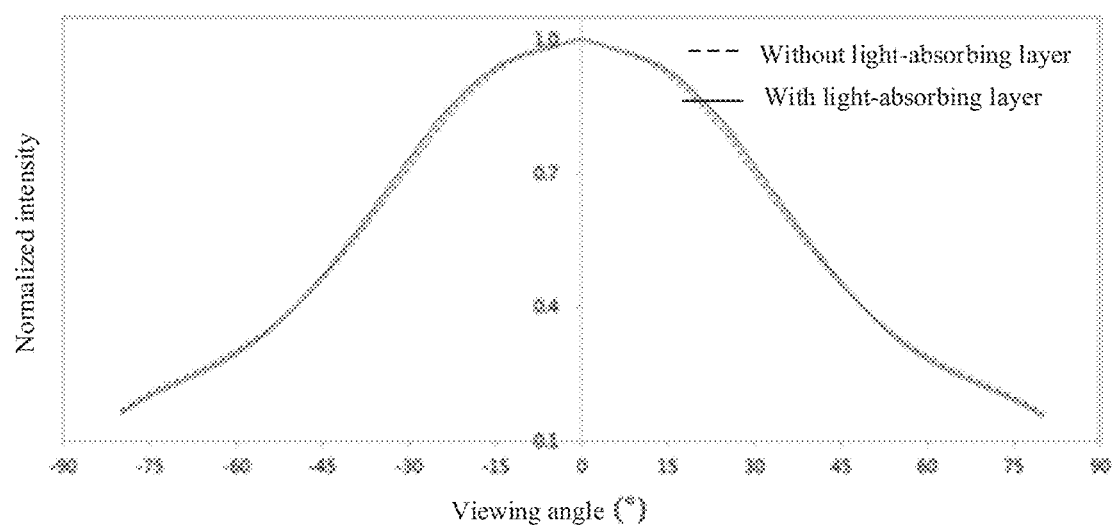
FIG. 17 shows the influence of a light-absorbing layer on brightness reduction of green light at a viewing angle of 0-80°.

FIG. 17 shows the influence of the light-absorbing layer on brightness reduction trend of green light at a viewing angle of 0-80°. In the figure, the abscissa represents the viewing angles, the ordinate represents a normalized intensity of brightness, the dotted line represents the green light brightness reduction trend without the light-absorbing layer, and the solid line represents the green light brightness reduction trend with the light-absorbing layer. It can be seen that at a small angle (for example, <45° and)>−45°, the reduction trend tends to be gentle, and the reduction of the green light brightness with the light-absorbing layer is slightly slower than that without the light-absorbing layer, and at a large angle (for example, >45° or <−45°, there is no readily apparent difference. Therefore, compared with that without the light-absorbing layer, the light-absorbing layer can slow down the reduction of the green light brightness at a small viewing angle and maintain better display brightness. Since the viewing angle of the display panel is usually small, the light-absorbing layer has a positive effect on maintaining ideal brightness.

Figure 18:
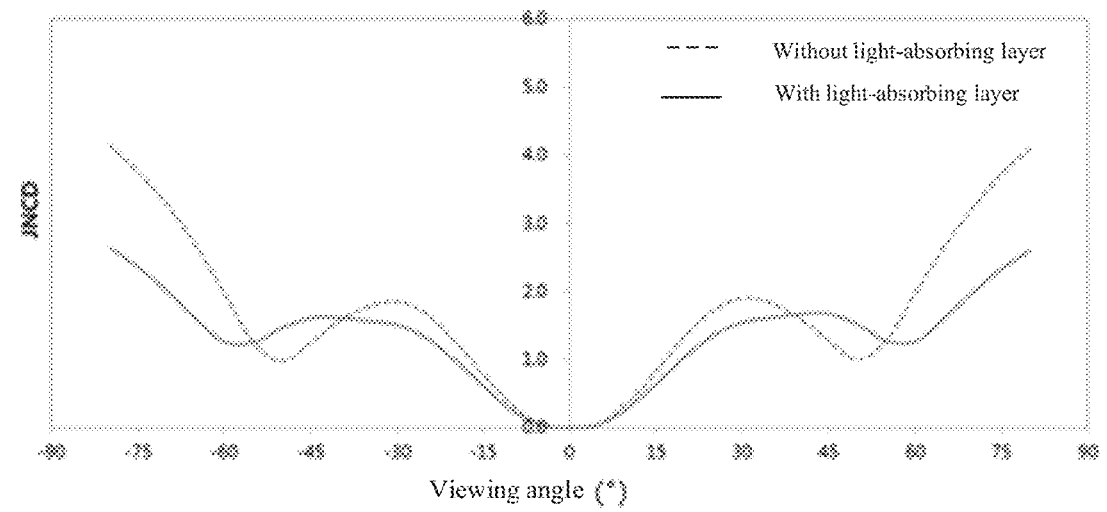
FIG. 18 shows the influence of a light-absorbing layer on a just noticeable color difference of green light at a viewing angle of 0-80°.

FIG. 18 shows the influence of the light-absorbing layer on a just noticeable color difference (JNCD) of green light at a viewing angle of 0-80°. In the figure, the abscissa represents the viewing angles, the ordinate represents the just noticeable color difference values (JNCD value), G5 represents the JNCD value without the light-absorbing layer, and G6 represents the JNCD value with the light-absorbing layer. It can be seen that at a small angle (for example, <35° and)>−35°, the JNCD value with the light-absorbing layer is smaller than that without the light-absorbing layer. At a large angle (for example, >50° or) <−50°, the JNCD value with the light-absorbing layer is smaller than that without the light-absorbing layer. Therefore, compared that without the light-absorbing layer, the light-absorbing layer can reduce the color shift of green light at most viewing angles and improve the color tone accuracy.

Figure 19:
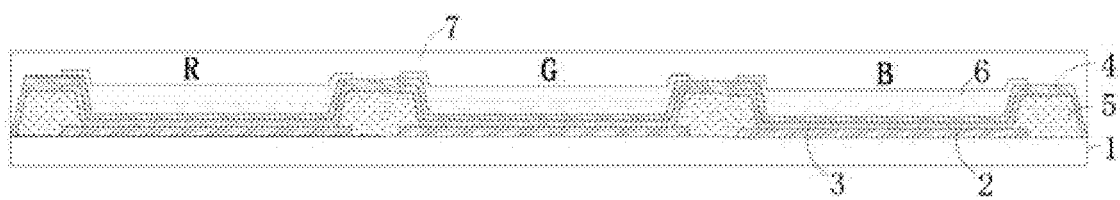
FIG. 19 is a schematic structural diagram of an RGB three-color OLED sub-pixel according to an embodiment of the present disclosure.
Figure 20:
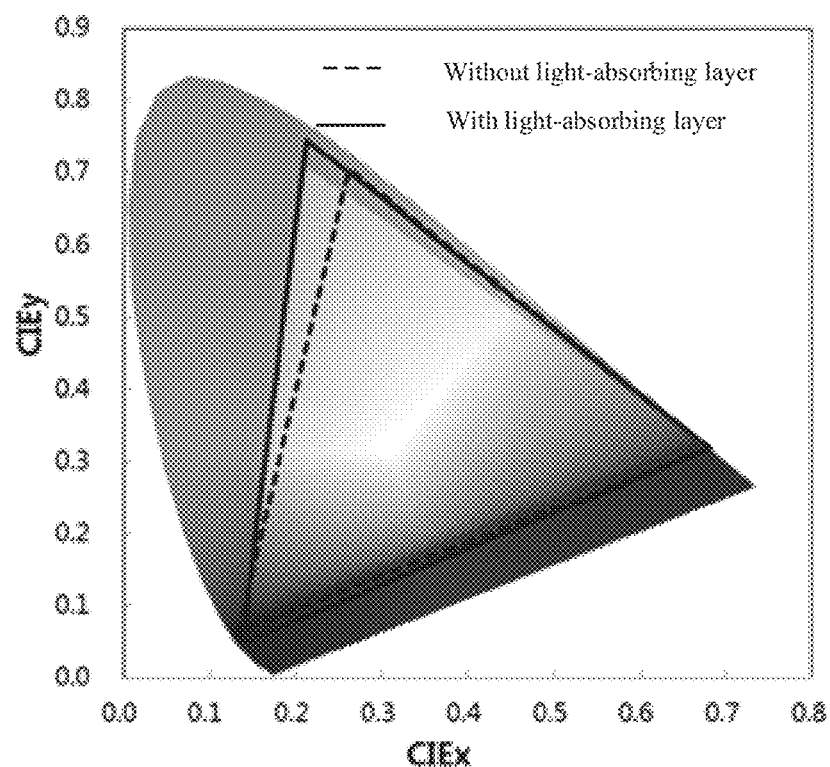
FIG. 20 shows the common influence of a light-absorbing layer of a blue sub-pixel and a light-absorbing layer of a green sub-pixel on a color gamut.

For the RGB three-color OLED display, as shown in FIG. 19, arranging the light-absorbing layer 6 in the blue and green sub-pixels at the same time may further increase the display color gamut. FIG. 20 is a CIE1931 chromaticity diagram shown by the above two. The triangular area enclosed by the dashed line represents the luminous color gamut without the light-absorbing layer, and the triangular area enclosed by the solid line represents the luminous color gamut with the light-absorbing layer. Compared with the NTSC standard color gamut, the color gamut without the light-absorbing layer is 100.5%, and the color gamut with the light-absorbing layer is increased to 113%. It can be seen that the effect of widening the color gamut by arranging the light absorbing layer in the blue and green sub-pixels at the same time is more significant than that by arranging the light absorbing layer in only one color sub-pixel.

Figure 21:
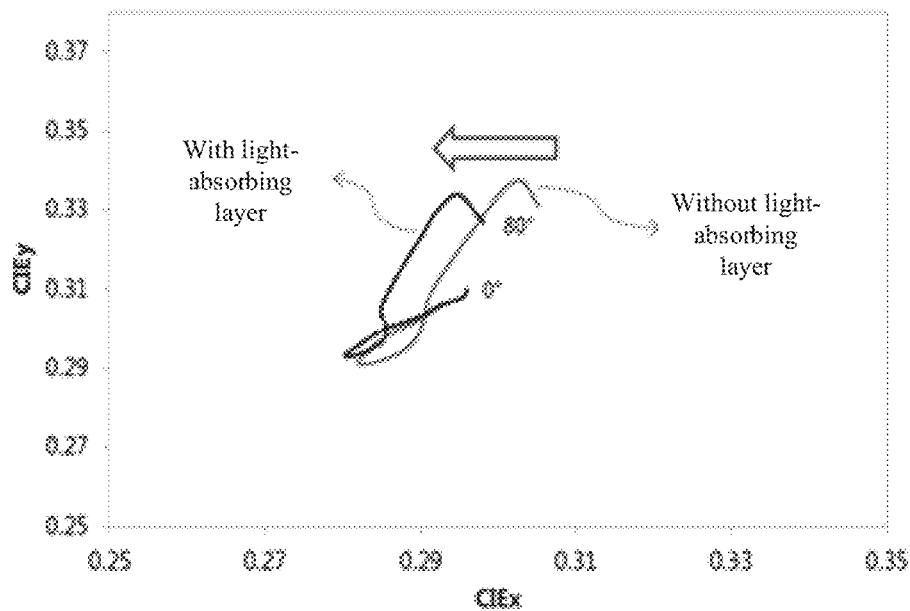
FIG. 21 shows the influence of a light-absorbing layer on a white light CIE locus at a viewing angle of 0-80°.

In addition, after the spectrum is cut by the blue light-absorbing layer and the green light-absorbing layer, the brightness reduction of blue and green light at a large viewing angle is relatively small. When the blue and green light along with the red light form white light, the locus trend of the color coordinate of white light at the large viewing angle is significantly improved. This is because as the viewing angle increases, the blue and green light spectrum gradually shift to the shortwave. The degree of overlap between the emission spectrum and the absorption spectrum at a large viewing angle gradually decreases, that is, the absorption layer absorbs the emission spectrum at a small viewing angle more and absorbs the emission spectrum at a large viewing angle less, which will cause the brightness reduction at a large viewing angle to become slower. With the adjustment ability of the light-absorbing layer for the brightness reduction of blue and green light at the large viewing angle, through the matching of red, green, and blue, the control function of the optical characteristics of the white light at the large viewing angle can be realized. CIE1931 color coordinates corresponding to the emission spectra of white light with and without the light-absorbing layer at different viewing angles are calculated respectively. As shown in FIG. 21, the dashed line is a white light CIE locus without the light-absorbing layer at a viewing angle of 0-80°, the solid line is a white light CIE locus with the light-absorbing layer at a viewing angle of 0-80°, the abscissa CIEx represents a white light x value, and the ordinate CIEy represents a white light y value. It can be seen that within the entire viewing angle range of 0-80°, the white light CIE locus moves to the left as a whole. Taking a viewing angle of 0° as an example, the CIE color coordinates of the three primary colors without the light-absorbing layer is R (0.681, 0.319), G (0.261, 0.704) and B (0.133, 0.065), which becomes R (0.681, 0.319), G (0.213, 0.744) and B (0.137, 0.049) after the spectrum is cut by the light-absorbing layer. As shown in FIG. 22, the white light generated after matching the blue and green light after being cut by the light-absorbing layer with the red light is significantly shifted to the cyan at the large viewing angle compared to the white light before the spectrum is cut, which changes the spectrum of white light at a large viewing angle, and the spectrum locus of white light at the large viewing angle is successfully moved to the cyan area where the human eye is not sensitive, reducing the human eye's sensitivity to color shift.

From the above analysis, it can be seen that the light-absorbing layer 6 has readily apparent effects on increasing the color saturation of blue and green light, widening the color gamut, delaying the brightness attenuation, and improving the color cast. Therefore, it can be used in an OLED display panel to improve the display effect. Although the red photoluminescence spectrum curve also has a tailing peak, the tailing peak has not been found to have adverse effects on the color saturation and color gamut.

In an embodiment, the tailing peak of the blue light is between 480-510 nm, so the light-absorbing layer corresponding to the blue sub-pixel preferably comprises a material with the absorption peak wavelength of the absorption spectrum curve being between 480-510 nm, which has good absorption to the light between 480-510 nm, and thus can effectively cut the tailing peak of blue light. In other embodiments, when the tailing peak of blue light is in other wavelength bands, the material of the light-absorbing layer corresponding to the absorption peak wavelength can be selected.

Specifically, the material with the absorption peak wavelength between 480-510 nm may be a compound represented by the following structural formula (1):

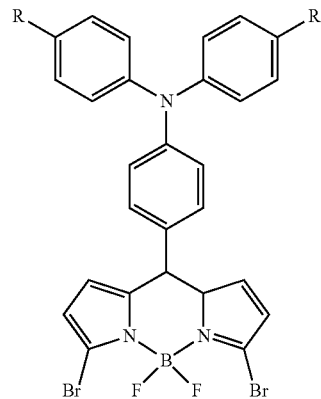

Structural formula (1)

The compound represented by structural formula (1) is a derivative material based on a core structure of boron dipyrromethene (BODIPY). A film formed by this material has a strong absorption band in the region of 480-510 nm, and has a molar absorption coefficient as high as 74130 $M^{-1}cm^{-1}$. In addition, the structure is a donor-acceptor structure formed by triphenylamine and BODIPY, and a charge transfer state in the molecule effectively reduces the photoluminescence efficiency thereof. After the film absorbs the tailing peak of blue light, the photoluminescence phenomenon thereof can be basically ignored, and has no effect on the luminescence of the OLED device.

In an embodiment, the tailing peak of green light is between 560 nm-610 nm, so the light-absorbing layer corresponding to the green sub-pixel preferably comprises a material with the absorption peak wavelength of the absorption spectrum curve between 560-610 nm, which has good absorption to the light between 560-610 nm, and thus can effectively cut the tailing peak of green light. In other embodiments, when the tailing peak of green light is in other wavelength bands, the material of the light-absorbing layer corresponding to the absorption peak wavelength can be selected.

Specifically, the material with an absorption peak wavelength between 560-610 nm may be a compound represented by the following structural formula (2):

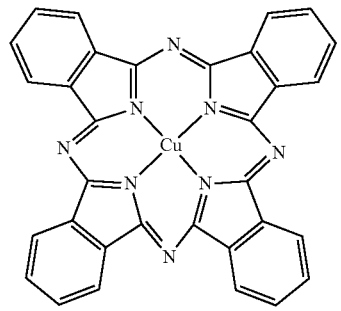

Structural formula (2)

The compound represented by the structural formula (2) is a copper phthalocyanine material, which has a strong absorption band in the region of 560nm-610nm and also has a high molar absorption coefficient, and is a classic organic photovoltaic donor material. The photoluminescence quantum efficiency is also very low, and after absorbing the tailing peak of green light, it will not affect the spectrum of the OLED device.

Those skilled in the art can understand that, in addition to the above-mentioned materials that can be used for the light-absorbing layer, other materials with strong absorption in the tailing peak waveband can also be used for the light-absorbing layer, which will not be illustrated.

In an embodiment, the OLED display panel is a monochrome display panel, that is, all sub-pixels are sub-pixels of the same color. For example, all sub-pixels are blue sub-pixels or all sub-pixels are green sub-pixels to form a blue display or a green display. Arranging the light-absorbing layer in the monochrome display panel may improve the monochrome display effect. The light-absorbing layer may be arranged in at least one of the sub-pixels, or may be arranged in all sub-pixels. Understandably, when all the sub-pixels are provided with the light-absorbing layer, the light-emitting effect of each sub-pixel may be ensured to be consistent, and the effect of improving monochromatic light is the best. The monochrome display is usually used in a display device such as a vehicle display.

In an embodiment, the OLED display panel is, for example, the RGB three primary color full-color OLED display panel shown in FIG. 19, that is, all sub-pixels are divided into red sub-pixels, green sub-pixels, and blue sub-pixels. Only the blue sub-pixel or only the green sub-pixel is provided with the light-absorbing layer 6, or both the blue and green sub-pixels may be provided with the light-absorbing layer, both of which can improve the display effect. According to the above analysis, arranging the light-absorbing layer in both the blue and green sub-pixels has the best effect on improving the color gamut. The full-color display panel is generally used in various display devices such as televisions and computers.

It should be noted that the sub-pixels in the above two embodiments all refer to normal sub-pixels in the display area, so that the light-emitting effect can be controlled. While the display panel usually also has a dummy pixel area (a dummy area) in the non-display area, the light-absorbing layer 6 may also be arranged in the sub-pixels of the dummy pixel area in the present disclosure. Of course, since the sub-pixels in the dummy pixel area are not for displaying, the light-absorbing layer 6 may not be provided in the dummy pixel area.

In an embodiment, when the display panel is the RGB three-primary color OLED display panel, the sub-pixels further include a pixel defining layer 5 as shown in FIG. 19, which is used for defining sub-pixel areas of different colors and has an opening. The light-absorbing layer 6 corresponding to the sub-pixel is located in the opening in the pixel defining layer 5. During the preparation, because it is difficult to ensure that the light-absorbing layer 6 and the organic electroluminescent layer 3 are exactly in the opening, in fact, the edge part of the light-absorbing layer 6 and the organic electroluminescent layer 3 will cover the pixel defining layer 5 (as shown in FIG. 2). The opening of the pixel defining layer 5 usually has a sufficient depth to adjust the thickness of the light-absorbing layer 6. By controlling the thickness of the light-absorbing layer 6, the absorption intensity and transmittance of the blue and green light trailing peaks of the light-absorbing layer 6 may be precisely controlled. In a film layer located in the opening of the pixel defining layer 5 and in the direction perpendicular to the display panel, the distance from the surface of the light-absorbing layer 6 away from the base substrate 1 to the base substrate 1 is less than or equal to the distance from the surface of the pixel defining layer 5 away from the base substrate 1 to the base substrate 1, that is, as shown in FIG. 2, in the opening, the height of the upper surface of the light-absorbing layer 6 does not exceed the height of the upper surface of the pixel defining layer 5, thereby facilitating subsequent planarization or encapsulation.

In an embodiment, the thickness of the light-absorbing layer does not exceed 1 μm. If the thickness of the film layer is greater than 1 μm, the transmittance of the film material thereof may decrease, thereby affecting the display effect. Controlling the thickness within 1 μm may balance absorption strength and transmittance.

In an embodiment, as shown in FIG. 19, each sub-pixel further includes an encapsulation layer 7. The encapsulation layer 7 is formed at a side of the cathode layer away from the organic light-emitting function layer 3 and covers the light-absorbing layer 6 to isolate water and oxygen and protect the internal film. For the sub-pixel provided with the light-absorbing layer 6, the light-absorbing layer 6 is located between the encapsulation layer 7 and the cathode layer, and the light-absorbing layer 6 is protected by the encapsulation layer 7, which will not affect the microcavity structure of the OLED device, and can also avoid the influence of environmental humidity and water and oxygen erosion. The encapsulation layer may be an encapsulation film or encapsulation glass, which is not specifically limited in the present disclosure.

An embodiment of the present disclosure also provides a method of manufacturing the above-mentioned organic electroluminescence display panel. Referring to FIG. 23, the method includes:

step S100, providing a base substrate 1 on which a first electrode layer 2, an organic light-emitting function layer 3, and a second electrode layer 4 of each of the sub-pixels are sequentially formed, the second electrode layer being arranged at a light emitting side;

step S200, forming a light-absorbing layer 6 on a side of the second electrode layer 4 of at least one of the sub-pixels away from the organic light-emitting function layer 3, projections of the light-absorbing layer 6 and the organic light-emitting function layer 3 on the base substrate 1 being overlapped with each other.

An absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel.

Taking a bottom emission device as an example again, in step S100, first, the first electrode layer 2, that is, an anode layer, is formed on the base substrate 1. The anode layer may comprise a material of transparent ITO and the like, and may be formed by evaporation, inkjet printing and the like. Then, the organic light-emitting function layer 3 is formed on the anode layer. The organic light-emitting functional layer 3 may include an electron injection layer, an electron transport layer, a light emitting layer, a hole transport layer and a hole injection layer which are stacked, and may further include film layers such as an electron barrier layer and a hole barrier layer. These film layers may also be formed by methods such as evaporation, inkjet printing, and deposition. Then, the second electrode layer 4, that is, a cathode layer, is formed on the organic light-emitting function layer 3. The material of the cathode layer may be metal, which may be formed by magnetron sputtering or the like.

In step S200, regardless of whether the material of the light-absorbing layer is the aforementioned organic small molecule material or other organic macromolecular materials, the light-absorbing layer 6 may be formed by an evaporation method. When the light-absorbing layer is made of organic macromolecular materials, it may also be formed by inkjet printing.

Further, the method of manufacturing the display panel in an embodiment further includes step S300.

In step S300, an encapsulation layer 7 covering the cathode layer and the light-absorbing layer is formed. For the sub-pixels that are not provided with the light-absorbing layer 6, the encapsulation layer 7 covers the cathode layer. For the sub-pixels provided with the light-absorbing layer 6, the encapsulation layer covers the light-absorbing layer 6, that is, the light-absorbing layer 6 is located between the encapsulation layer 7 and the cathode layer, so that the encapsulation layer protects the underlying film layers.

The above OLED display panel and manufacturing method are all described using the bottom emission type as an example. For a top emission type, the anode layer is arranged on the light emitting side, so the light-absorbing layer 6 may be arranged on the side of the anode layer away from the organic light emitting function layer 3, which can also control light emission, the specific principle and structure will not be repeated here. The OLED display panel of the present disclosure may be either an AMOLED display panel or a PMOLED display panel.

An embodiment of the present disclosure also provides a display device including the above-mentioned OLED display panel. The resulting display device has a wider color gamut and greatly improved display effect, which can satisfy higher display requirements, and greatly expand the application field.

The present disclosure does not specifically limit the application of the display device. The display device may be any product or component with a display function, such as a TV, a notebook computer, a tablet computer, a mobile phone, a car display, a navigation, an e-book, a digital photo frame, an advertising light box, and the like.

Although relative terms such as "upper" and "lower" are used in the specification to describe the relative relationship between one component and another component shown, these terms are used in the specification only for convenience of description, for example, according to the example direction shown in the figures. It can be understood that if a device shown is turned over, a component described as "upper" will become the "lower" component. When a structure is "on" another structure, it may mean that the structure is integrally formed on said another structure, or that the structure is "directly" installed on said another structure, or that the structure is "indirectly" installed on said another structure through other structure.

The terms "a", "an", "the", "said" and "at least one" are used to indicate the presence of one or more elements/components/etc.; and the terms "include" and "have" are used to indicate an open-ended inclusive means and means that there may be additional elements/components/etc. in addition to the listed elements/components/etc..

Those skilled in the art may easily conceive of other embodiments of the present disclosure after considering the specification and practicing the invention disclosed herein. The present application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are only regarded as exemplary, and the true scope and spirit of the present disclosure are pointed out by the appended claims.

What is claimed is:

1. An organic electroluminescence display panel, comprising:
   a base substrate on which a plurality of sub-pixels are formed, each of the sub-pixels comprising a first electrode layer and a second electrode layer arranged opposite to each other; and an organic light-emitting function layer between the first electrode layer and the second electrode layer, the second electrode layer being arranged at a displaying side of the organic light-emitting function layer, wherein at least one of the sub-pixels further comprises:
   a light-absorbing layer arranged at a side of the second electrode layer away from the organic light-emitting function layer, projections of the light-absorbing layer and the organic light-emitting function layer on the base substrate being overlapped with each other,
   wherein an absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel,
   wherein;
   the plurality of sub-pixels comprise red sub-pixels, green sub-pixels, and blue sub-pixels, wherein each of the green sub-pixels or each of the blue sub-pixels comprises the light-absorbing layer,
   the sub-pixel further comprise a pixel defining layer for defining a sub-pixel area, the pixel defining layer has an opening, and the light-absorbing layer corresponding to the sub-pixel comprises a portion located in the opening of the pixel defining layer, and
   in the opening and in a direction perpendicular to the display panel, a distance from a surface of the light-absorbing layer away from the base substrate to the base substrate is less than or equal to a distance from a surface of the pixel defining layer away from the base substrate to the base substrate.

2. The organic electroluminescence display panel according to claim 1, wherein a thickness of the light-absorbing layer is not greater than 1 μm.

3. The organic electroluminescence display panel according to claim 1, wherein each of the sub-pixels further comprises an encapsulation layer formed at a side of the second electrode layer away from the organic light-emitting function layer and covering the light-absorbing layer.

4. The organic electroluminescence display panel according to claim 1, wherein the absorption peak wavelength of the absorption spectrum curve of the light-absorbing layer corresponding to the blue sub-pixel is between 480-510 nm.

5. The organic electroluminescence display panel according to claim 4, wherein a material of the light-absorbing layer comprises a compound represented by a following structural formula (1):

structural formula (1)

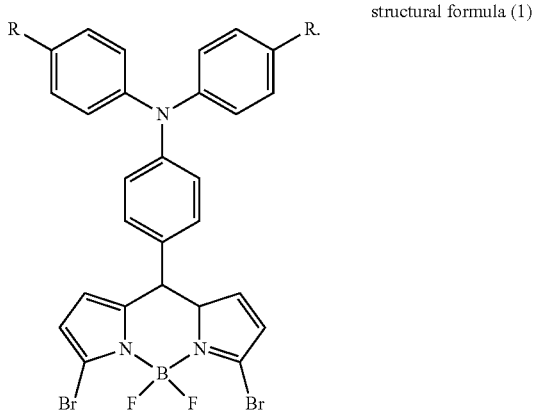

6. The organic electroluminescence display panel according to claim 1, wherein the absorption peak wavelength of the absorption spectrum curve of the light-absorbing layer corresponding to the green sub-pixel is between 560-610 nm.

7. The organic electroluminescence display panel according to claim 6, wherein a material of the light-absorbing layer comprises a compound represented by a following structural formula (2):

structural formula (2)

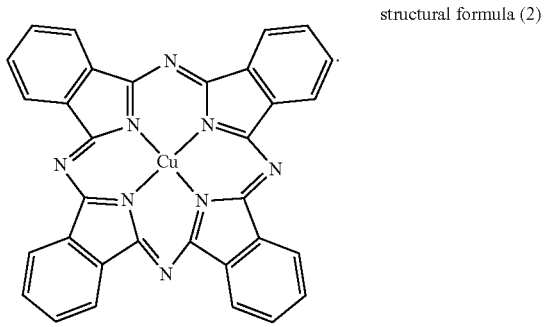

8. A method for manufacturing an organic electroluminescence display panel comprising a plurality of sub-pixels, comprising:
providing a base substrate on which a first electrode layer, an organic light-emitting function layer, and a second electrode layer of each of the sub-pixels are sequentially formed, the second electrode layer being arranged at a displaying side of the organic light-emitting function layer;
forming a light-absorbing layer on a side of the second electrode layer of at least one of the sub-pixels away from the organic light-emitting function layer, projections of the light-absorbing layer and the organic light-emitting function layer on the base substrate being overlapped with each other,
wherein an absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel,
wherein:
the plurality of sub-pixels comprise red sub-pixels, green sub-pixels, and blue sub-pixels, wherein each of the green sub-pixels or each of the blue sub-pixels comprises the light-absorbing layer,
the sub-pixel further comprise a pixel defining layer for defining a sub-pixel area, the pixel defining layer has an opening, and the light-absorbing layer corresponding to the sub-pixel comprises a portion located in the opening of the pixel defining layer, and
in the opening and in a direction perpendicular to the display panel, a distance from a surface of the light-absorbing layer away from the base substrate to the base substrate is less than or equal to a distance from a surface of the pixel defining layer away from the base substrate to the base substrate.

9. The method for manufacturing the organic electroluminescence display panel according to claim 8, wherein the light-absorbing layer is formed by an evaporation method.

10. The method for manufacturing the organic electroluminescence display panel according to claim 8, further comprising: forming an encapsulation layer covering the second electrode layer and the light-absorbing layer.

11. A display device comprising an organic electroluminescence display panel, the organic electroluminescence display panel comprising:
a base substrate on which a plurality of sub-pixels are formed, each of the sub-pixels comprising a first electrode layer and a second electrode layer arranged opposite to each other; and an organic light-emitting function layer between the first electrode layer and the second electrode layer, the second electrode layer being arranged at a displaying side of the organic light-emitting function layer, wherein at least one of the sub-pixels further comprises:
a light-absorbing layer arranged at a side of the second electrode layer away from the organic light-emitting function layer, projections of the light-absorbing layer and the organic light-emitting function layer on the base substrate being overlapped with each other,
wherein an absorption peak wavelength of an absorption spectrum curve of the light-absorbing layer is greater than an emission peak wavelength of an emission spectrum curve of a corresponding sub-pixel, a minimum absorption wavelength of the absorption spectrum curve of the light-absorbing layer is greater than a minimum emission wavelength of the emission spectrum curve of the corresponding sub-pixel, and a wavelength range covered by the absorption spectrum curve of the light-absorbing layer overlaps with a wavelength range covered by the emission spectrum curve of the corresponding sub-pixel,
wherein:
the plurality of sub-pixels comprise red sub-pixels, green sub-pixels, and blue sub-pixels, wherein each of the green sub-pixels or each of the blue sub-pixels comprises the light-absorbing layer,
the sub-pixel further comprise a pixel defining layer for defining a sub-pixel area the pixel defining layer has an opening, and the light-absorbing layer corresponding to the sub-pixel comprises a portion located in the opening of the pixel defining layer, and
in the opening and in a direction perpendicular to the display panel, a distance from a surface of the light-absorbing layer away from the base substrate to the base substrate is less than or equal to a distance from a surface of the pixel defining layer away from the base substrate to the base substrate.

12. The display device according to claim 11, wherein the absorption peak wavelength of the absorption spectrum curve of the light-absorbing layer corresponding to the blue sub-pixel is between 480-510 nm.

13. The display device according to claim 12, wherein a material of the light-absorbing layer comprises a compound represented by a following structural formula (1):

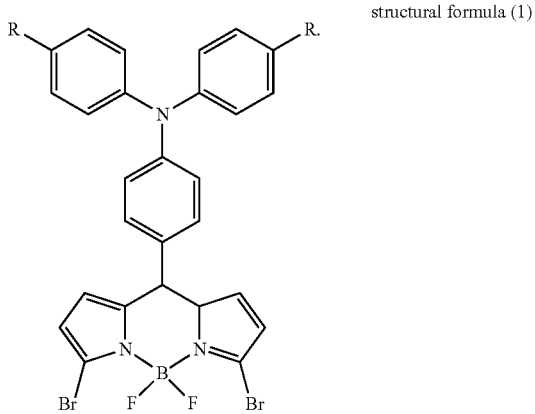

structural formula (1)

14. The display device according to claim 11, wherein the absorption peak wavelength of the absorption spectrum curve of the light-absorbing layer corresponding to the green sub-pixel is between 560-610 nm.

15. The display device according to claim 14, wherein a material of the light-absorbing layer comprises a compound represented by a following structural formula (2):

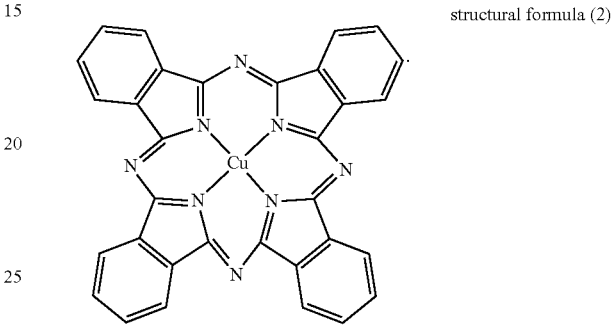

structural formula (2)

* * * * *